(12) United States Patent
Narayanan L

(10) Patent No.: US 12,376,239 B2
(45) Date of Patent: Jul. 29, 2025

(54) MODULAR PRINTED CIRCUIT BOARD ASSEMBLY AND METHOD TO OPERATE THE SAME

(71) Applicant: E-CON SYSTEMS INDIA PRIVATE LIMITED, Chennai (IN)

(72) Inventor: Sathiya Narayanan L, Chennai (IN)

(73) Assignee: E-CON SYSTEMS INDIA PRIVATE LIMITED (IN)

( * ) Notice: Subject to any disclaimer, the term of this patent is extended or adjusted under 35 U.S.C. 154(b) by 400 days.

(21) Appl. No.: 18/178,658

(22) Filed: Mar. 6, 2023

(65) Prior Publication Data

US 2024/0306318 A1  Sep. 12, 2024

(51) Int. Cl.
  *H05K 5/00* (2025.01)
  *H05K 5/02* (2006.01)
  *H05K 7/14* (2006.01)

(52) U.S. Cl.
  CPC ........... *H05K 5/003* (2013.01); *H05K 5/0069* (2013.01); *H05K 5/026* (2013.01); *H05K 7/1449* (2013.01); *H05K 2201/10492* (2013.01); *H05K 2203/1105* (2013.01)

(58) Field of Classification Search
  CPC ...... H05K 5/003; H05K 5/0069; H05K 5/026; H05K 7/1449; H05K 2201/10492; H05K 2203/1105
  See application file for complete search history.

(56) References Cited

U.S. PATENT DOCUMENTS

| | | | |
|---|---|---|---|
| 6,982,876 B1 | 1/2006 | Young | |
| 11,140,770 B2 | 10/2021 | Chiu | |
| 2017/0164459 A1* | 6/2017 | Kim | H05K 7/20336 |
| 2018/0049307 A1* | 2/2018 | de Bock | H05K 1/0203 |
| 2021/0161003 A1* | 5/2021 | Sadri | H05K 1/0272 |
| 2022/0274450 A1 | 9/2022 | Scheifele et al. | |

FOREIGN PATENT DOCUMENTS

JP   2008258513 A   10/2008

* cited by examiner

*Primary Examiner* — Pete T Lee
(74) *Attorney, Agent, or Firm* — Jason C. Cameron

(57) ABSTRACT

A modular printed circuit board assembly is provided. The modular printed circuit board assembly includes a housing unit. The housing unit includes a plurality of connectors, a heat transfer unit, and an identification unit. The plurality of connectors connects a host interface board of a plurality of host interface boards with a plurality of module boards and connects a module board of the plurality of module boards with the plurality of host interface boards. The host interface board includes information about an electronic device. The heat transfer unit dissipates the heat to a heat sink. The heat sink is a passive heat exchanger for conducting the heat generated by the electronic device. The identification unit is configured to read the unique identification of the electronic device from the host interface board to determine a structural combination of the electronic device.

20 Claims, 8 Drawing Sheets

MODULAR PRINTED CIRCUIT BOARD ASSEMBLY AND METHOD TO OPERATE THE SAME

FIELD OF INVENTION

Embodiments of a present disclosure relate to a field of printed circuit boards and more particularly to a modular printed circuit board and a method to operate the same.

BACKGROUND

A printed circuit board (PCB) is a medium used in electronic devices to connect electronic components to one another in a controlled manner. The printed circuit board is used to mechanically support and electrically connect electronic components using conductive pathways, tracks, and the like. There are many types of PCBs such as single PCBs, double-sided PCD, multilayer PCB, and the like. Several devices such as cameras use PCB as a camera PCB. The camera PCB combines camera optics and digital technology. PCB cameras come with optical devices and image sensors mounted directly on a circuit board.

Traditionally a camera product design consists of an image sensor, image co-processor, microcontroller, and host interface. To make the product design compact, an image sensor, image co-processor, microcontroller, and host interface vital chips are placed in two PCBs instead of a single PCB. Thus, the entire product has two PCBs interfaced via connectors for data transmission. For new product variants, the two printed circuit boards must be modified according to the new design needs which will lead to the design of new boards. This requires maintenance and involves investment in terms of inventory and the cost of production for every new design.

There is a need for a system that is cost-effective. Also, there is a need of a system that has a production-friendly design. Further, there is need of a system that provides re-usability of printed circuit boards. Furthermore, there is a need of a method that is easily adaptable. Also, there is a need for a system and method that provides more stability to the PCB mounting.

Hence, there is a need for a modular printed circuit board, and a method to operate the same addresses the aforementioned issues.

BRIEF DESCRIPTION

In accordance with one embodiment of the disclosure a modular printed circuit board is disclosed. The modular printed circuit board includes a housing unit associated with a product. The housing unit includes a plurality of connectors, a heat transfer unit, and an identification unit. The plurality of connectors disposed on a plurality of printed circuit boards. The plurality of connectors is configured to connect a host interface board of a plurality of host interface boards with a plurality of module boards. The plurality of connectors is also configured to connect a module board of the plurality of module boards with the plurality of host interface boards. The host interface board includes information of an electronic device. The heat transfer unit is operatively connected with the plurality of connectors, wherein the heat transfer unit is configured to dissipate the heat to a heat sink, and wherein a heat sink is a passive heat exchanger for conducting the heat generated by the electronic device. The identification unit is operatively connected with one of the plurality of host interface boards, wherein the identification unit is configured to read the unique identification of the electronic device from the host interface board to determine a structural combination of the electronic device.

In accordance with another embodiment, a method for operating the modular printed circuit board is disclosed. The method includes connecting, by a plurality of connectors of a housing unit, a host interface board of a plurality of host interface boards with a plurality of module boards. The method also includes connecting, by the plurality of connectors of the housing unit, a module board of the plurality of module boards with the plurality of host interface boards. Further, the method includes conducting, by a heat transfer unit of the housing unit, the heat to a heat sink, wherein a heat sink is a passive heat exchanger for conducting the heat generated by the electronic device. Furthermore, the method includes reading, by an identification unit of the housing unit, the unique identification of the electronic device from the host interface board to determine a structural combination of the electronic device.

In accordance with another embodiment, a method for working of a camera working process with respect to a modular printed circuit board assembly is provided. The method includes directing, the scattered light rays from the target object on an image sensor pixel area by using a lens chosen according to the requirement of a user. The method also includes converting, an equivalent voltage by the analogue-to digital-converter unit placed in each pixel wall depending upon the intensity of the light. Further, the method includes digitalizing, the analog voltage, and sent to digital data from an image sensor. Furthermore, the method includes receiving, the digital by an image co-processor, and the image processing is carried out, wherein the processed image is then sent as digital data to a micro-controller. Furthermore, the method includes converting, the digital data into data packets depending upon its configuration. Furthermore, the method includes receiving, the data packets by the host interface processor for further image processing activity.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which.

Figure 1:
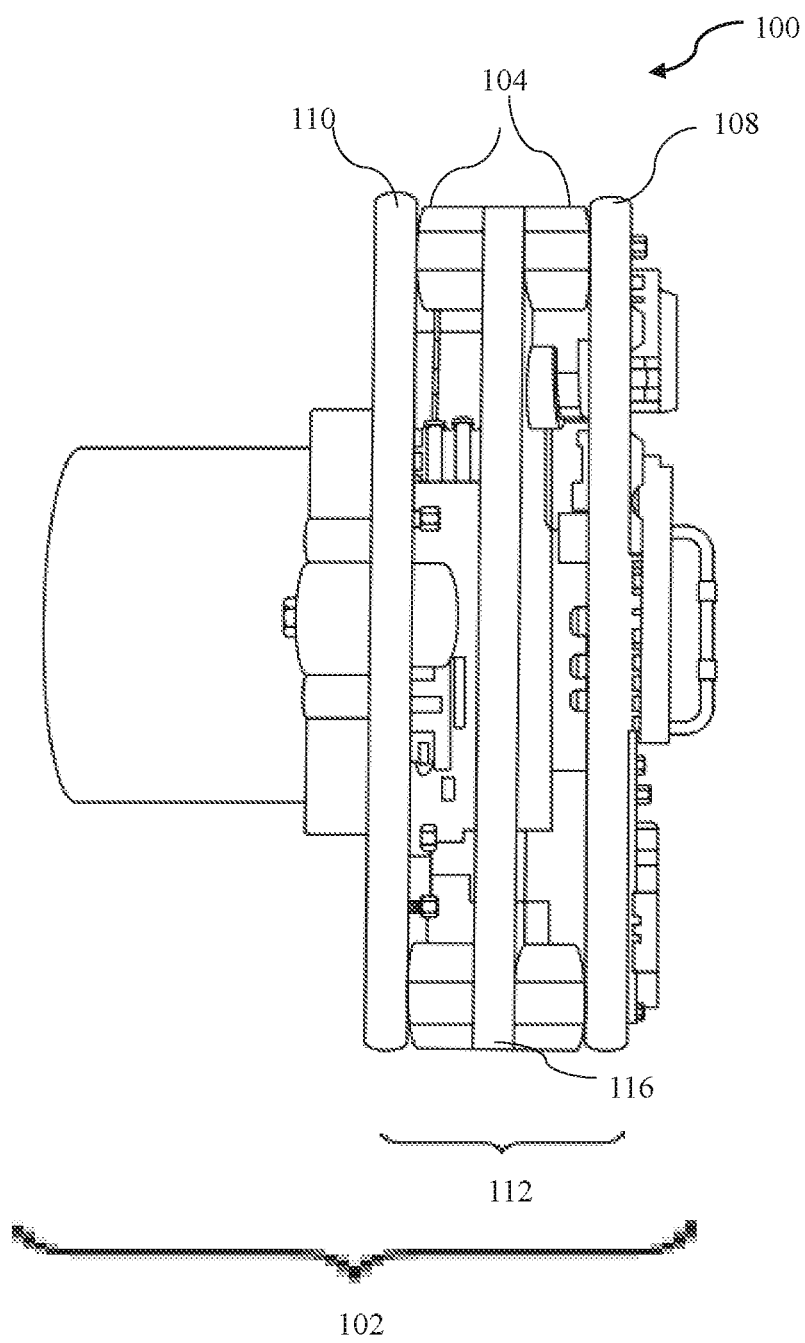
FIG. 1 is a schematic representation of a modular printed circuit board in accordance with an embodiment of the present disclosure.

Further, those skilled in the art will appreciate that elements in the figures are illustrated for simplicity and may not have necessarily been drawn to scale. Furthermore, in terms of the construction of the system, one or more components of the system may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or sub-systems or elements or structures or components preceded by "comprises . . . a" does not, without more constraints, preclude the existence of other devices, sub-systems, elements, structures, components, additional devices, additional sub-systems, additional elements, additional structures, or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

Embodiments of the present disclosure relate to a modular printed circuit board assembly and a method to operate the same. The modular printed circuit board includes a housing unit associated with a product. The housing unit includes a plurality of connectors, a heat transfer unit, and an identification unit. The plurality of connectors disposed on a plurality of printed circuit boards. The plurality of connectors is configured to connect a host interface board of a plurality of host interface boards with a plurality of module boards. The plurality of connectors is also configured to connect a module board of the plurality of module boards with the plurality of host interface boards. The host interface board includes an information of an electronic device. The heat transfer unit is operatively connected with the plurality of connectors, wherein the heat transfer unit is configured to dissipate the heat to a heat sink, and wherein a heat sink is a passive heat exchanger for conducting the heat generated by the electronic device. The identification unit is operatively connected with the plurality of host interface boards, wherein the identification unit is configured to read the unique identification of the electronic device from the host interface board to determine a structural combination of the electronic device. Further, the device described hereafter in FIG. 1 is the modular printed circuit board assembly.

FIG. 1 is a schematic representation of a modular printed circuit board assembly (100) in accordance with an embodiment of the present disclosure. The device (100) includes a housing unit (102) associated with an electronic. The housing unit (102) includes a plurality of connectors (104), a heat transfer unit (112), a host interface board (108), a module board (110), a mid-spacer (116), and an identification unit (114). In one embodiment the dimension of the enclosure of the product is larger than the dimensions of the module board (110) and the dimensions of the host interface board (108). In another embodiment, the plurality of host interface boards (108) is configured with equal dimensions, and the plurality of module boards (110) is configured with equal dimensions.

The plurality of connectors (104) disposed on a plurality of printed circuit boards (106). The plurality of connectors (104) is configured to connect a host interface board (108) of a plurality of host interface boards (108) with a plurality of module boards. The plurality of connectors (104) is configured to connect a module board (110) of the plurality of module boards with the plurality of host interface boards. The host interface board (108) includes an information on an electronic device. In one embodiment, the information of the electronic device may include a combination of the electronic device.

The heat transfer unit (112) is operatively connected with the plurality of connectors (104). The heat transfer unit (112) is configured to dissipate the heat using a heat sink, wherein a heat sink is a passive heat exchanger for conducting the heat generated by the electronic device. In one embodiment, the heat transfer unit (112) transfers heat generated by the electronic device into the atmosphere, hence avoiding the heating electronic device. The heat reduction of the electronic device causes an increase in the life of the electronic device.

The identification unit (114) is operatively connected with the plurality of host interface boards (108), wherein the identification unit (114) is configured to read the unique identification of the electronic device from the host interface board (108) to determine a structural combination of the electronic device. In one embodiment, the unique identification of the electronic device is positioned on the surface of the host interface board (108). In another embodiment, the unique identification is in the form of company name, company code, and the like.

Figure 2:
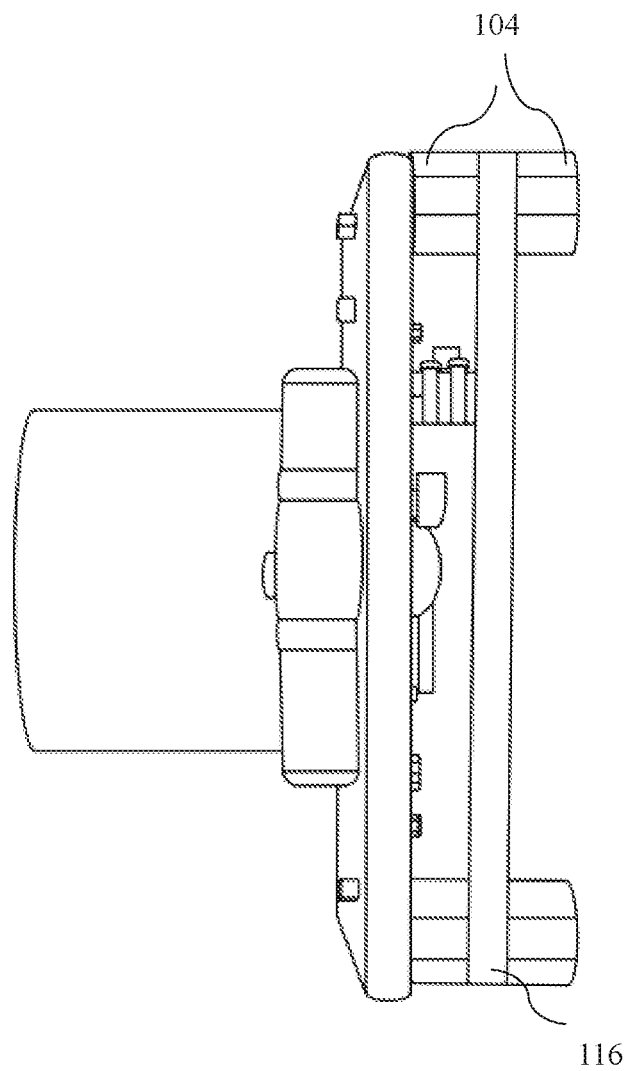
FIG. 2 is a schematic representation of a single printed circuit board with mid-spacer of FIG. 1 in accordance with an embodiment of the present disclosure.

FIG. 2 is a schematic representation of a single printed circuit board with a mid-spacer (116) of FIG. 1 in accordance with an embodiment of the present disclosure. The modular printed circuit board assembly (100) includes a housing unit (102). The housing unit (102) includes a plurality of connectors (104), a heat transfer unit (112), and an identification unit (114). In one embodiment, the housing includes a back spacer (122) for providing support to a plurality of cables (124) to improve the rigidity of the housing, wherein the plurality of cables (124) is the cables of the electronic product connected to the printed circuit board.

In one embodiment, the heat transfer unit (112) includes a mid-spacer (116) fitted in between the host interface board (108) and the module board (110). In FIG. 2, only the module board (110) is shown with the mid-spacer (116). In another embodiment, the mid-spacer (116) provides a screw fitting at the side of the host interface board (108) and the module board (110). In such an embodiment, the mid-spacer (116) includes a plurality of holes (120) at the top and bottom side to enable rigidity to the screw fitting. In one embodiment, the host interface is used in the applications like a universal serial bus (USB) interface board, peripheral component interconnects express (PCT-e) interface board, and gigabit multimedia serial link (GMSL) interface board. In one embodiment, the heat transfer unit (112) is configured to transfer heat produced by an image signal processor.

In one embodiment, the identification unit (114) is configured to read the unique identification of the product from the host interface board (108) using electrically erasable programmable read-only memory (EPROM). In one embodiment, the EPROM is a memory that does not lose its content when the power supply is cut off and that can be erased and reused. EPROMs are generally employed for programs designed for repeated use but can be upgraded with a later version of a program. In another embodiment, the unique identification of the product may be read from the host interface by using NOT-AND (NAND) gate which is a logic gate that produces an output that is false only if all its inputs are true. In such an embodiment, the unique identification of the product may be read from the host interface by using NOT-OR (NOR) is a logic gate that produces HIGH output results if both the inputs to the gate are LOW and if one or both input is HIGH, it produces a LOW output result.

In one embodiment, the image sensor receives scattered light rays on the image sensor pixel area by using a lens chosen according to the requirement of the user. In another embodiment, an equivalent voltage is digitalized based on an intensity of light, with the help of an analogue-to-digital converter placed in each pixel well and sent via camera interface.

Figure 3:
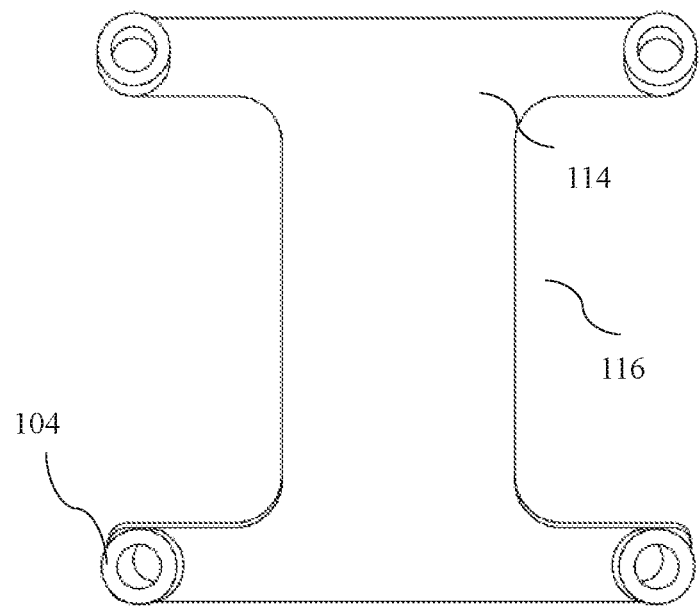
FIG. 3 is a schematic representation of a heat transfer unit of FIG. 1 in accordance with an embodiment of the present disclosure.
Figure 4:
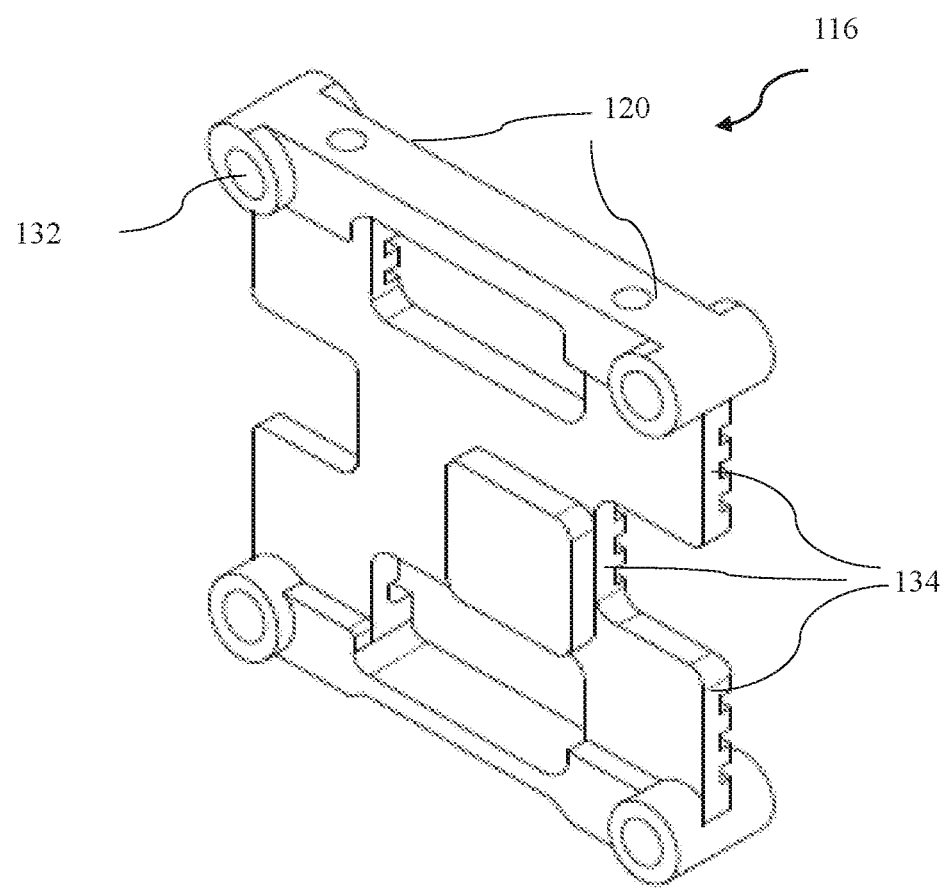
FIG. 4 is a schematic representation of the heat transfer unit without mounting of FIG. 1 in accordance with an embodiment of the present disclosure.

FIG. 3 is a schematic representation of a mid-spacer (116) of FIG. 1 in accordance with an embodiment of the present disclosure and FIG. 4 is a schematic representation of the heat transfer unit (112) without mounting of FIG. 1 in accordance with an embodiment of the present disclosure.

In one embodiment, the heat transfer unit (112) is configured to transfer heat produced by an image signal processor. In one embodiment, the image signal-processor receives the data from the camera interface for image processing, wherein the processed camera interface data is sent to a microcontroller. In another embodiment, the microcontroller converts the camera interface data into a plurality of data packets, wherein the plurality of data packets is received by the host interface board for the image processing activity. In one embodiment, the heat sink acts as a spacer between the plurality of printed circuit boards (106). In one embodiment, the mid-spacer (116) includes a plurality of perforated portions (132) positioned at a top side and a bottom side to enable rigidity to the screw fitting In one embodiment, the housing includes a back spacer (122) for providing support to a plurality of cables (124) to improve the rigidity of the housing, wherein the plurality of cables (124) is the cables of the electronic product connected to the printed circuit board as shown in FIG. 4. In one embodiment, the host interference board and the modular board have four holes for fitting with the heat transfer unit (112). In one embodiment, the one of the sides of the heat sink includes a plurality of grooves (134) configured to provide a large area for heat dissipation in all directions.

Figure 5:
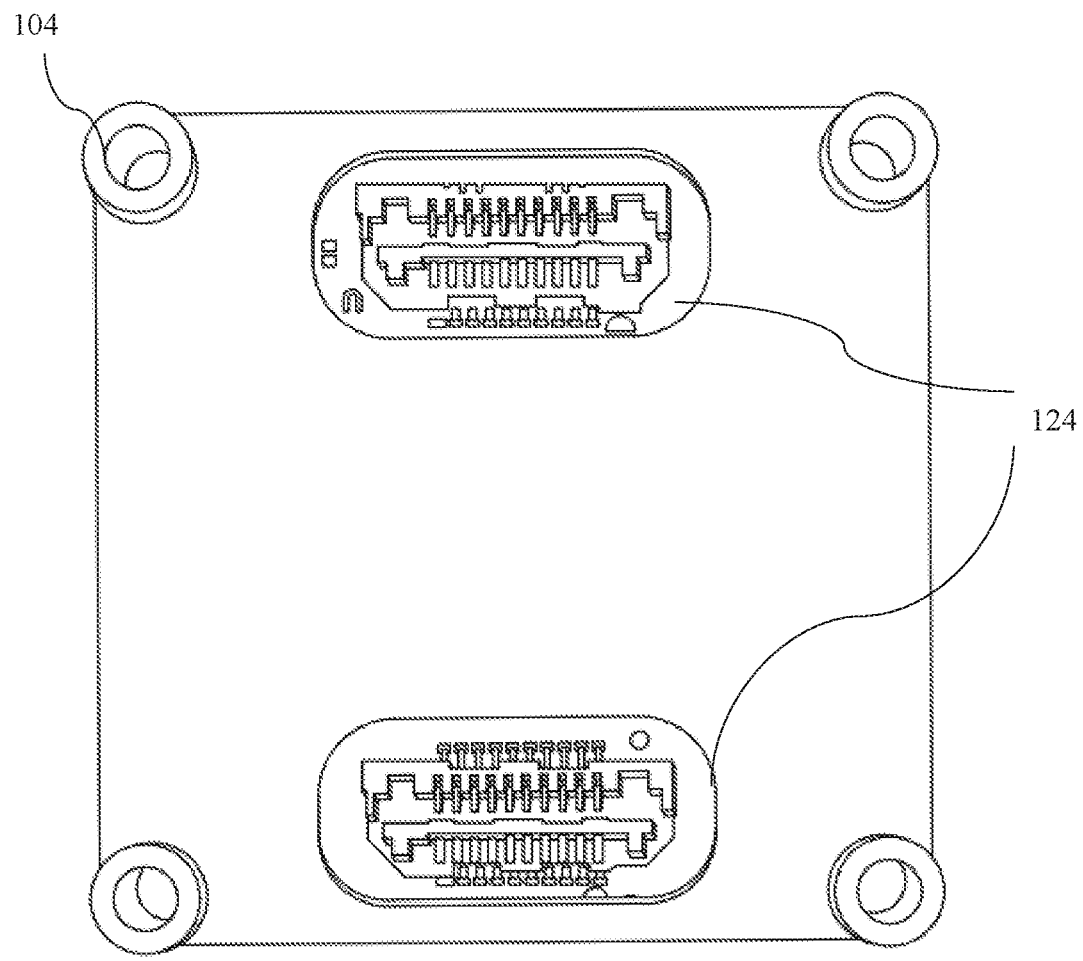
FIG. 5 is a schematic representation of the modular printed circuit board with a metal spacer and a mid-spacer of FIG. 1 in accordance with an embodiment of the present disclosure.

FIG. 5 is a schematic representation of the modular printed circuit board with a metal spacer (126) and a mid-spacer (116) of FIG. 1 in accordance with an embodiment of the present disclosure. In one embodiment, the heat transfer unit (112) is configured with a metal spacer (126) between the plurality of printed circuit boards (106). In another embodiment, the metal spacer (126) may be used for permanent fixing and connecting PCBs, modules, and other components. In such an embodiment, the metal spacer (126) is made up of copper alloy. However, the metal spacer (126) is not limited to copper alloy.

Figure 6:
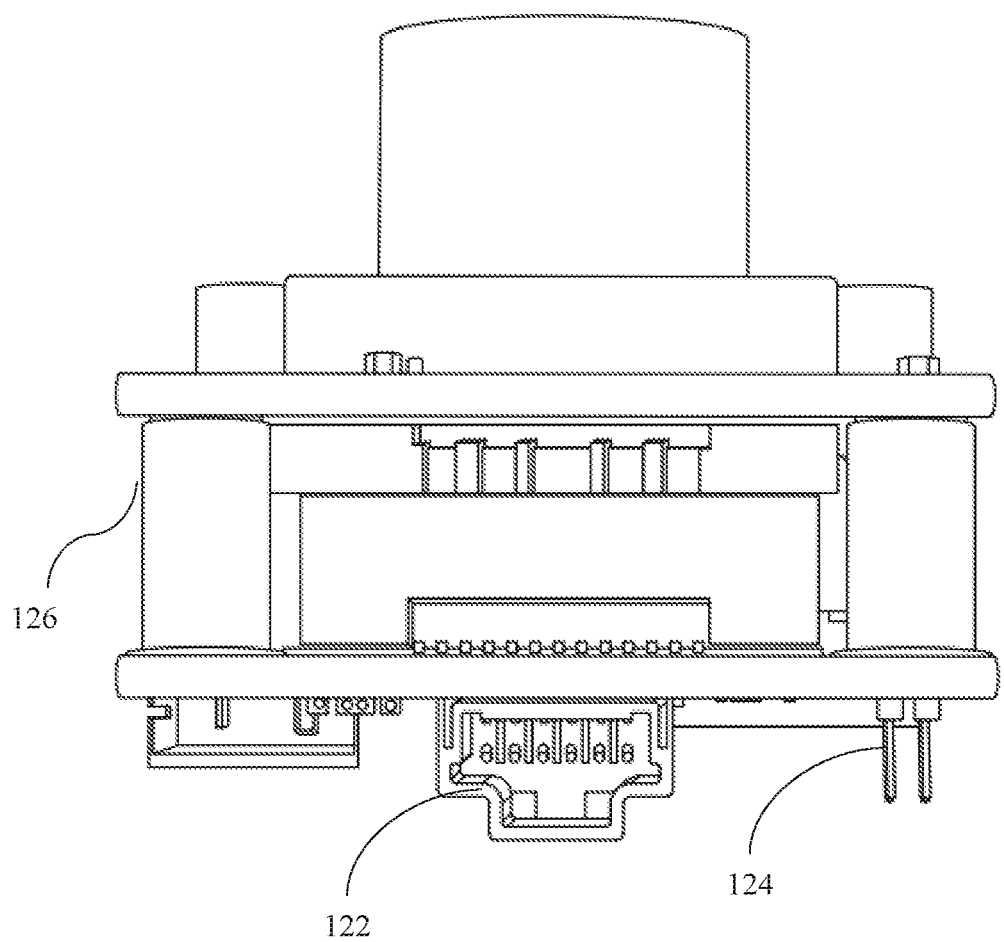
FIG. 6 is a schematic representation of the heat transfer unit with a single printed circuit board mounted of FIG. 1 in accordance with an embodiment of the present disclosure.

FIG. 6 is a schematic representation of the heat transfer unit (112) with a single printed circuit board mounted of FIG. 1 in accordance with an embodiment of the present disclosure. In one embodiment, the back side of the mid-spacer (116) includes two openings to connect the module board (110) with external cables.

Figure 7:
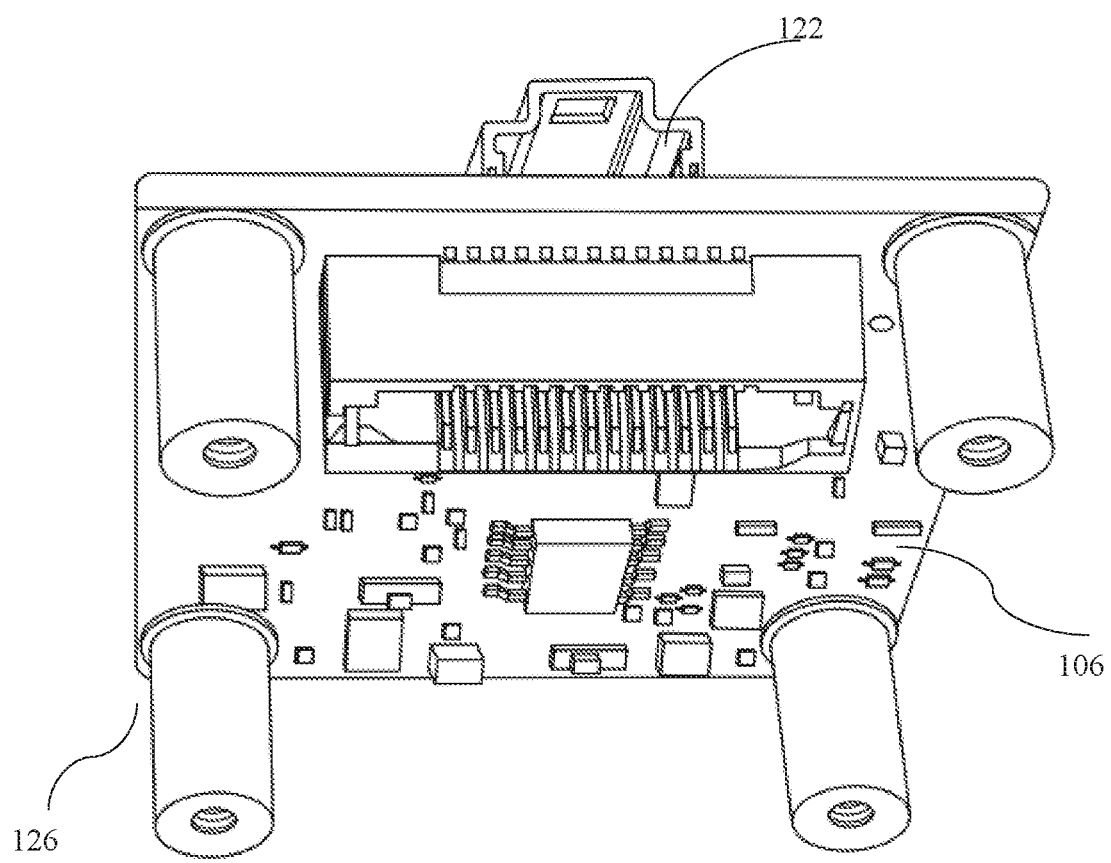
FIG. 7 is a block diagram of an exemplary embodiment representing a module board connected to a plurality of host interface boards of FIG. 1 in accordance with an embodiment of the present disclosure.

FIG. 7 is a block diagram of an exemplary embodiment representing a module board (110) connected to a plurality of host interface boards of FIG. 1 in accordance with an embodiment of the present disclosure. In one embodiment, the two products have two different host interface boards, but the two different host interface boards are connected to the same module board (110). For example, product 3 and product 4 are two different cameras that are connected to the same module boards (110).

Figure 8:
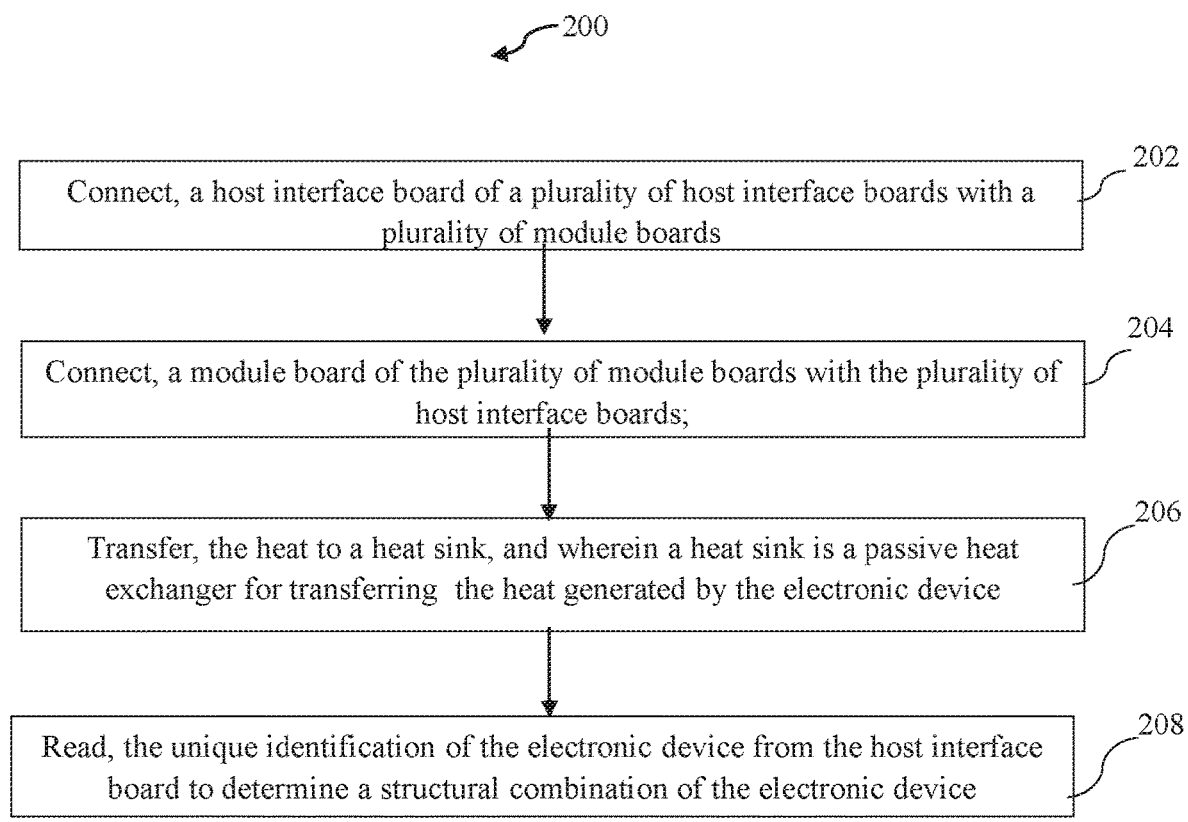
FIG. 8 is a flow chart representing steps involved in a method for operating a modular printed circuit board assembly in accordance with an embodiment of the present disclosure.

FIG. 8 is a flow chart representing steps involved in a method (200) for operating a modular printed circuit board in accordance with an embodiment of the present disclosure. The method (200) includes connecting, by a plurality of connectors of a housing unit, a host interface board of a plurality of host interface boards with a plurality of module boards in step (202). The method also includes providing, by a back spacer, support to a plurality of cables (124) to improve the rigidity of the housing, wherein the plurality of cables (124) is the cables of the electronic product connected to the printed circuit board.

The method (200) also includes connecting, by the plurality of connectors of the housing unit, a module board of the plurality of module boards with the plurality of host interface boards in step (204). The method includes using, dimension of the enclosure of the product is larger than the dimensions of the module board and the dimensions of the host interface board.

The method includes fitting, by four hole of the host interference board and the modular board, the four connectors of the plurality of connectors.

Further, the method (200) includes conducting, by a hear transfer unit of the housing unit, the heat to a heat sink, and wherein a heat sink is a passive heat exchanger for conducting the heat generated by the electronic device. The method includes spacing, by a mid-space of the heat transfer unit, in between the host interface board and the module board. The method also includes providing, a screw fitting at the side of the host interface board and the module board. The method also includes providing, rigidity to the screw fitting by a plurality of holes at the top and bottom side of the mid-spacer.

The method includes to conducting heat produced by an image signal processor. The method includes spacing, by the heat sink acts between the plurality of printed circuit boards. The method includes spacing, by a back spacer for providing support to a plurality of cables to improve the rigidity of the housing, wherein the plurality of cables is the cables of the electronic product connected to the printed circuit board. The method includes spacing, by a metal spacer, between the plurality of printed circuit boards. The method also includes fixing, by the metal spacer, the PCBs, modules, and other components.

Furthermore, the method includes reading, by an identification unit (114) of the housing unit, the unique identification of the electronic device from the host interface board to determine a structural combination of the electronic device. The method also includes reading the unique identification code of the product from the host interface board using electrically erasable programmable read-only memory. The method includes reusing, by electrically erasable programmable read-only memory that does not lose its content when the power supply is cut off and that can be erased.

Figure 9:
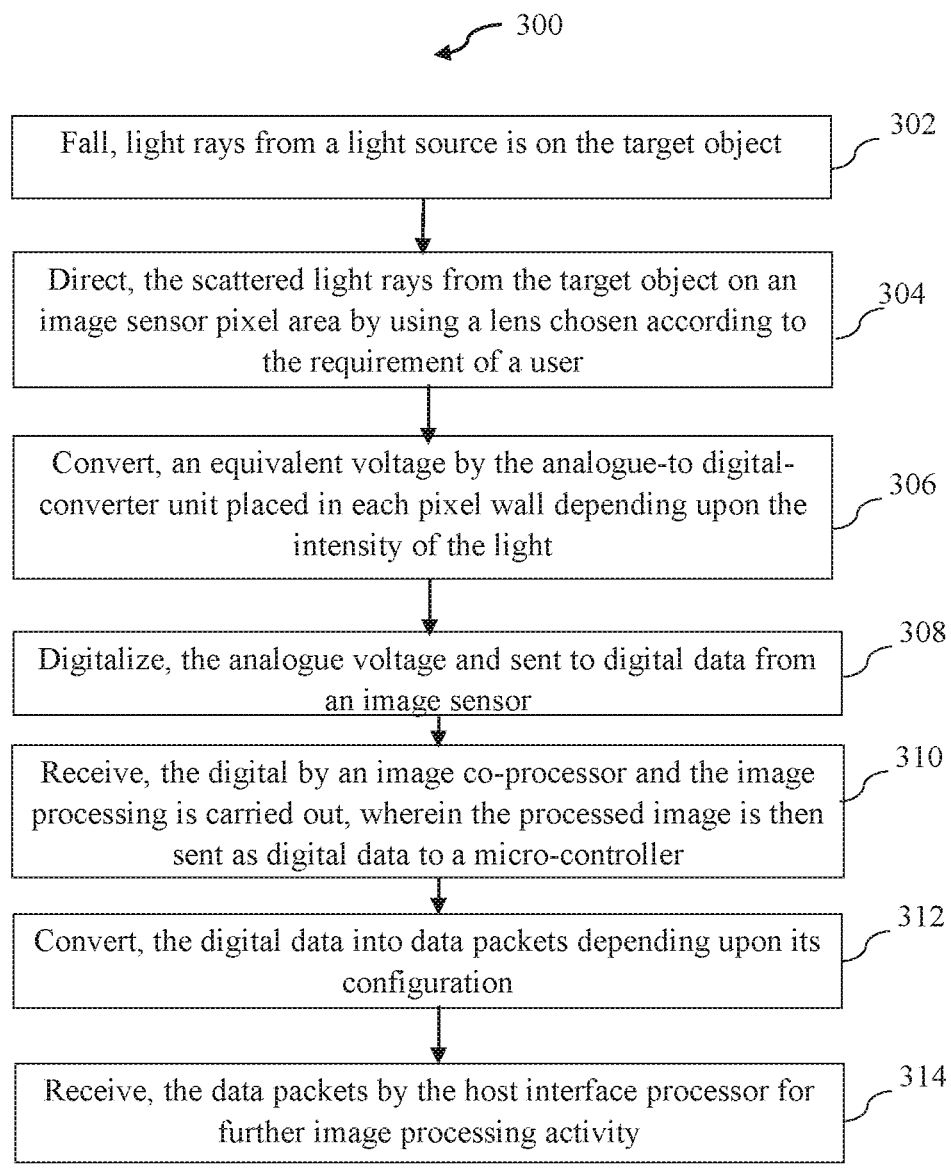
FIG. 9 is a flow chart representing steps involved in a method for a camera working process with respect to a modular printed circuit board assembly in accordance with an embodiment of the present disclosure.

FIG. 9 is a flow chart representing steps involved in a method (300) for a camera working process with respect to a modular printed circuit board assembly in accordance with an embodiment of the present disclosure. The method (300) includes falling, light rays from a light source is on the target object in step (302).

The method (300) also includes directing, the scattered light rays from the target object on an image sensor pixel area by using a lens chosen according to the requirement of a user in step (304). In one embodiment, Further, the method (300) includes converting, an equivalent voltage by the analogue-to digital-converter unit placed in each pixel wall depending upon the intensity of the light in step (306).

Furthermore, the method (300) includes digitalizing, the analogue voltage and sent to digital data from an image sensor in step (308). In one embodiment, the digital data is mobile industry processor interface (MIPI).

Furthermore, the method (300) includes receiving, the digital by an image co-processor and the image processing is carried out, wherein the processed image is then sent as digital data to a micro-controller in step (310).

Furthermore, the method (300) includes converting, the digital data into data packets depending upon its configuration in step (312). In one embodiment, the packets like universal serial bus (USB), Gigabit Multimedia Serial Link (GMSL), Ethernet, etc., Furthermore, the method (300) includes receiving, the data packets by the host interface processor for further image processing activity in step (314).

Various embodiments of the present disclosure provide a modular printed circuit board (PCB) which is interchangeable based on the device requirement. The modular printed circuit board disclosed in the present disclosure, provides a compact design of an image sensor, image co-processor, microcontroller, and host interface vital chips that are placed in two PCBs instead of a single PCB. In the present disclosure no need to design new PCB for new variant of a new product. The present disclosure requires less maintenance. The present disclosure has less involvement in investment in terms of inventory. The modular printed circuit board disclosed in the present disclosure is cost effective as the cost of production for every new design is reduced.

Further, the present disclosure provides a production-friendly design. The present disclosure that provides re-usability of printed circuit boards and is therefore cost-effective. Furthermore, the present disclosure is easily adaptable. The modular printed circuit board disclosed in the present disclosure provides stability to the PCB mounting. The modular printed circuit board disclosed in the present disclosure provides heat reduction in the electronic device. The less the electronic gets heated, the more the life of the electronic device is increased.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

I claim:
1. A modular printed circuit board assembly comprising:
   a housing unit associated with an electronic device comprises:
      a plurality of connectors disposed on a plurality of printed circuit boards, wherein the plurality of connectors is configured to:
         connect a host interface board of a plurality of host interface boards with a plurality of module boards; and
         connect a module board of the plurality of module boards with the plurality of host interface boards,
      wherein, the host interface board is configured with information of an electronic device;
      a heat transfer unit operatively coupled with one of the plurality of connectors, wherein the heat transfer unit is configured to dissipate heat to a heat sink, and wherein the heat sink is a passive heat exchanger for conducting the heat generated by the electronic device; and
      an identification unit operatively connected with one of the plurality of host interface boards, wherein the identification unit is configured to read the unique identification of the electronic device from the host interface board to determine a structural combination of the electronic device.
2. The modular printed circuit board assembly as claimed in claim 1, wherein the heat transfer unit comprises a mid-spacer fitted in between the host interface board and the module board.

3. The modular printed circuit board assembly as claimed in claim 2, wherein the mid-spacer provides a screw fitting positioned at a plurality of lateral sides of the host interface board and the module board.

4. The modular printed circuit board assembly as claimed in claim 3, wherein the mid-spacer comprises a plurality of perforated portion positioned at a top side and a bottom side to enable rigidity to the screw fitting.

5. The modular printed circuit board assembly as claimed in claim 1, wherein the heat sink comprises a plurality of grooves configured to provide a large area for heat dissipation in all directions.

6. The modular printed circuit board assembly as claimed in claim 1, wherein the housing unit is operated with a combination of the plurality of host interface boards and the plurality of module boards connected via the plurality of connectors.

7. The modular printed circuit board assembly as claimed in claim 1, wherein the housing unit comprises a back spacer for providing support to a plurality of cables to improve the rigidity of the housing, wherein the plurality of cables is the cables of the electronic product connected to the printed circuit board.

8. The modular printed circuit board assembly as claimed in claim 1, wherein the heat transfer unit is configured to transfer heat produced by an image signal processor.

9. The modular printed circuit board assembly as claimed in claim 1, wherein the heat transfer unit is configured with a metal spacer between the plurality of printed circuit boards.

10. The modular printed circuit board assembly as claimed in claim 1, wherein the identification unit is configured to read the unique identification of the product from the host interface board using electrically erasable programmable read-only memory.

11. The modular printed circuit board assembly as claimed in claim 1,
wherein the image sensor receives scattered light rays on the image sensor pixel area by using a lens chosen according to the requirement of the user; and
wherein based on an intensity of light, an equivalent voltage is digitalized with the help of an analogue-to-digital converter placed in each pixel well and sent to a camera interface.

12. The modular printed circuit board assembly as claimed in claim 1, wherein the plurality of printed circuit boards is interchangeably attached to the base at the bottommost stacked position with an image signal processor.

13. The modular printed circuit board assembly as claimed in claim 12, wherein the image signal processor receives the data from the camera interface for processing, wherein the processed camera interface data is sent to a microcontroller.

14. The modular printed circuit board assembly as claimed in claim 13, wherein the microcontroller converts the camera interface data into a plurality of data packets, wherein the plurality of data packets is received by the host interface board for the image processing activity.

15. The modular printed circuit board assembly as claimed in claim 1, wherein the host interference board and the modular board have four holes for fitting with the heat transfer unit.

16. The modular printed circuit board assembly as claimed in claim 1, comprises a base configured for mechanical attachment with the plurality of connectors, wherein the base includes an attachment configured to attach to one of the host interferences boards and the module board in a stacked position.

17. The modular printed circuit board assembly as claimed in claim 1, wherein the base comprises an opening for facilitating an external connection to the printed circuit board.

18. A method for operating a modular printed circuit board assembly comprises:
connecting, by a plurality of connectors of a housing unit, a host interface board of a plurality of host interface boards with a plurality of module boards;
connecting, by the plurality of connectors of the housing unit, a module board of the plurality of module boards with the plurality of host interface boards;
conducting, by a hear transfer unit of the housing unit, the heat to a heat sink, and wherein a heat sink is a passive heat exchanger for conducting the heat generated by the electronic device; and
reading, by an identification unit of the housing unit, the unique identification of the electronic device from the host interface board to determine a structural combination of the electronic device.

19. The method according to claim 16, comprises using, dimension of the enclosure of the product is larger than the dimensions of the module board and the dimensions of the host interface board.

20. A method for working of a camera working process with respect to a modular printed circuit board assembly comprises:
directing, the scattered light rays from the target object on an image sensor pixel area by using a lens chosen according to the requirement of a user;
converting, an equivalent voltage by the analogue-to-digital-converter unit placed in each pixel wall depending upon the intensity of the light;
digitalizing, the analogue voltage and sent to digital data from an image sensor;
receiving, the digital by an image co-processor and the image processing is carried out, wherein the processed image is then sent as digital data to a micro-controller;
converting, the digital data into data packets depending upon its configuration; and
receiving, the data packets by the host interface processor for further image processing activity.

* * * * *